(12) United States Patent
Fischer et al.

(10) Patent No.: US 6,406,979 B2
(45) Date of Patent: Jun. 18, 2002

(54) METHOD FOR SECTIONING A SUBSTRATE WAFER INTO A PLURALITY OF SUBSTRATE CHIPS

(75) Inventors: Frank Fischer; Eckhard Graf, both of Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/891,051

(22) Filed: Jun. 25, 2001

(30) Foreign Application Priority Data

Jun. 27, 2000 (DE) .......................................... 100 31 252

(51) Int. Cl.⁷ ..................... H01L 21/46; H01L 21/78; H01L 21/301
(52) U.S. Cl. ....................................... 438/460; 438/465
(58) Field of Search .................................. 438/460, 465

(56) References Cited

U.S. PATENT DOCUMENTS 5,972,781 A * 10/1999 Wegleiter et al. ........... 438/460

* cited by examiner

*Primary Examiner*—John F. Niebling
*Assistant Examiner*—David Zarneke
(74) *Attorney, Agent, or Firm*—Kenyon & Kenyon

(57) ABSTRACT

A method for sectioning a substrate wafer into a plurality of substrate chips enables a process management that is particularly timesaving and flexible with respect to the producible surface areas of the substrate chips. For this purpose, the substrate chips are separated from one another by a selective deep patterning method, a plasma etching method in particular.

11 Claims, 5 Drawing Sheets

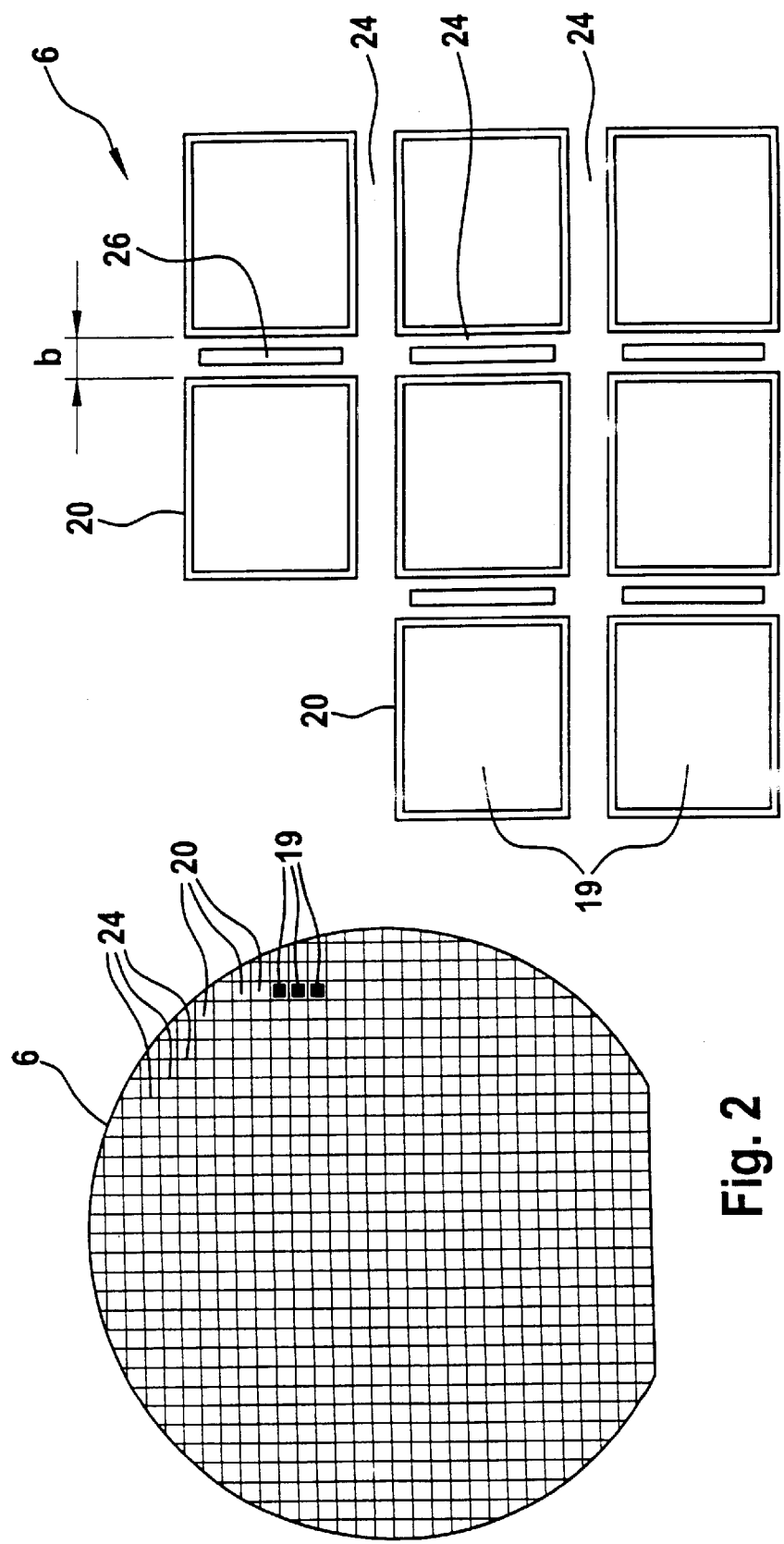

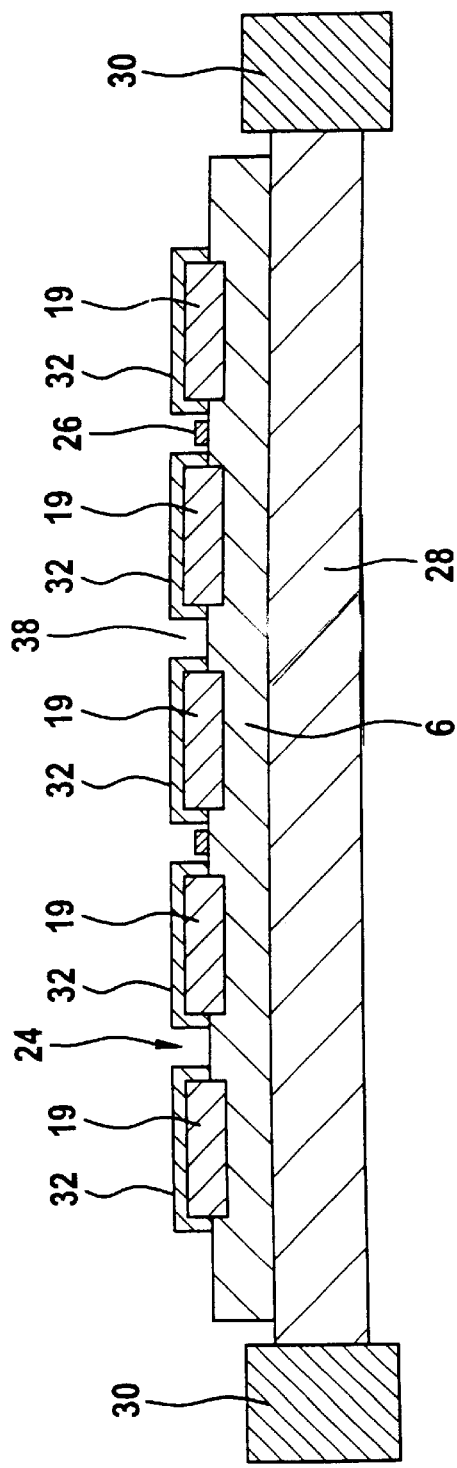
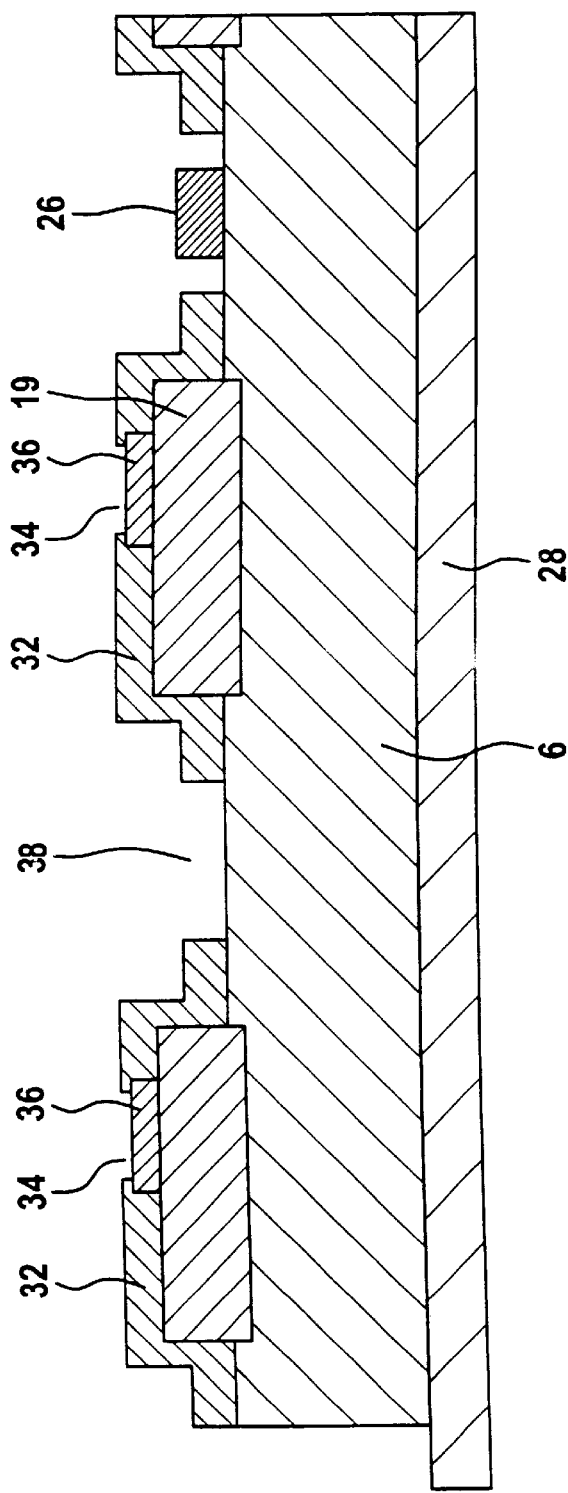

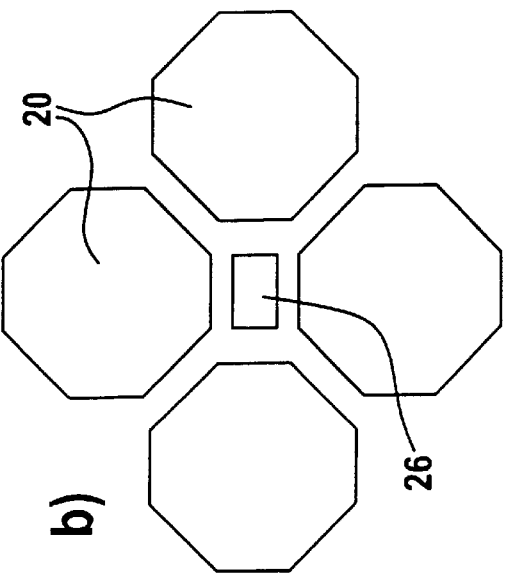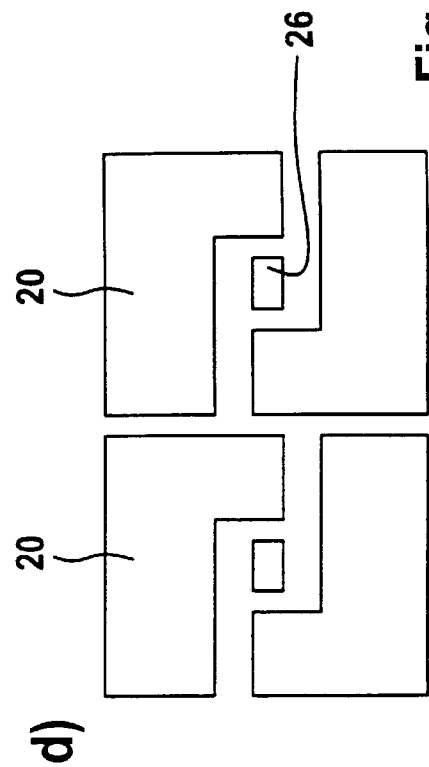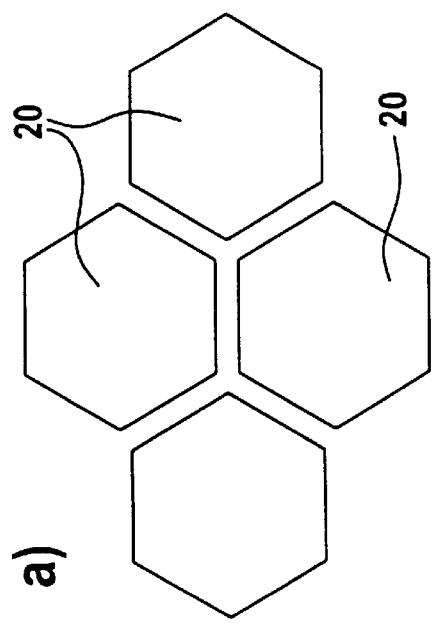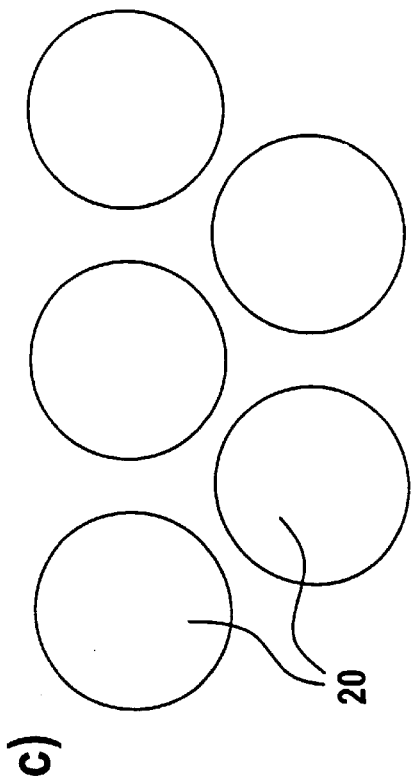
Fig. 7

METHOD FOR SECTIONING A SUBSTRATE WAFER INTO A PLURALITY OF SUBSTRATE CHIPS

FIELD OF THE INVENTION

The present invention relates to a method for sectioning a substrate wafer into a plurality of substrate chips

BACKGROUND INFORMATION

Microelectronic components, such as computer chips or electronics chips, are typically produced within the framework of so-called planar technology. In this context, the substrate wafers made of a material suitable as a carrier material for the component, such as silicon, are coated in a series of subsequent coating and patterning steps with a suitable sequence of layers of the respective material later active in the component. In this context, after coating with a material, this material layer patterned, e.g., using patterning methods based on photoresist. The patterning ensures that the final material layer only covers those parts of the component-chip surface that require coating by the particular material for functional reasons.

Especially in the field of the mass production of components, a plurality of components is typically produced in parallel in one operation, in a particularly timesaving and cost-effective manner of manufacture. In this context, a comparatively large substrate wafer having a diameter of about 6 or 8 inches, for example, is coated according to the described method, a plurality of components being ultimately disposed next to one another on the surface of the substrate wafer. In other words, the multi-layered patterns necessary for a plurality of components are simultaneously produced by coating the substrate wafer.

Subsequent to the coating and patterning process, the components are present on one single substrate wafer. Therefore, an additional step is necessary in which the substrate wafer is sectioned into a plurality of substrate chips in such a manner that, in each case, every substrate chip only carries the layer structure intended for an individual component.

For this purpose, the substrate wafer typically undergoes a saw process after coating and patterning are completed. In this process, the substrate wafer is cut by a diamond-covered saw blade first in a line-by-line manner and then in a column-by-column manner. For this purpose, the substrate wafer is laminated or mounted onto a carrier film. Rotating the typically ring-shaped saw blade at a frequency of up to 20,000 rpm results in an abrasive material removal along the so-called saw cut.

However, due to the necessary material removal in a horizontal as well as vertical direction, such a saw process requires at least two process steps and is, therefore, time-consuming. In addition, the saw process essentially permits only a rectangular surface area for the substrate chip produced by sectioning; due to the increased number of necessary cutting directions, a comparatively more complicated surface area, e.g., in the shape of a polygon, would result in an even more unfavorable expenditure of processing time. Thus, with respect to the attainable surface areas of the substrate chip, the saw process has only limited flexibility.

SUMMARY

An object of the present invention is to provide a method for sectioning a substrate wafer into a plurality of substrate chips, the method enabling a process management that is especially timesaving and flexible with respect to the producible substrate-chip surface areas.

With regard to the method, this objective is achieved according to the present invention in that the substrate chips are separated from one another by a selective deep patterning method.

In this context, a deep patterning method is a method in which a laterally bounded material removal can be adjusted in a targeted manner, there being a preferential direction of the material removal into the depth of the processed material. In a selective deep patterning method, the removal action is additionally limited to a defined group of target materials.

The present invention is based on the consideration that the particular time expenditure resulting from the typically provided saw process, on the one hand, and the limited flexibility, on the other hand, are dependent on the driving direction of this process, namely in a lateral direction or in a direction parallel to the surface of the substrate wafer. However, the substrate wafer can be sectioned in a manner that is timesaving as well as flexible with respect to the achievable surface areas for the substrate chips in that a process is provided for segmenting that has a driving direction leading into the substrate wafer and oriented in a direction perpendicular to its surface. This can be achieved by a deep patterning method having a preferential direction into the substrate wafer due to the physical-chemical marginal conditions.

For a particularly extensive possible scope of application, a silicon wafer is advantageously sectioned as the substrate wafer, a selective deep patterning method for silicon being used. In this context, a material having a particularly effective removal action especially for silicon due to its physical-chemical properties is used as the patterning agent or etchant.

In one embodiment, a plasma etching method is used as the deep patterning method. In such a plasma etching method, the substrate wafer to be sectioned is exposed to an atmosphere of a etching gas. By supplying energy into the etching gas, e.g., using microwave irradiation, the gas is partially ionized and, therefore, forms a plasma. A portion of the thereby produced plasma ions, e.g., the positively charged cations, are then accelerated by an accelerating voltage toward the substrate wafer and impinge in an almost vertical direction upon the wafer's surface. In response to the impingement, the ions accelerated in the plasma react with the material of the substrate wafer, volatile reaction products being produced, and the material of the substrate wafer being locally dissolved. Furthermore, the accelerated ions knock off debris from the surface of the substrate wafer, thereby employing an etching operation. In response to the surface areas of the substrate wafer that are not to be etched being suitably covered, this process can be restricted to the desired separation areas.

As a result of the impingement direction of the ions upon the surface of the substrate wafer, such a plasma etching process exhibits a characteristic preferential direction of the removal process into the depth of the substrate wafer and is, therefore, particularly suitable as a deep patterning method. In addition, all of the surface areas of the substrate wafer can be parallelly and simultaneously processed, without the etching action being affected, e.g., by the crystal directions of the substrate wafer. Thus, the most different substrate-chip surface areas can be produced in a particularly simple manner. When processing a substrate wafer made of silicon, an $SF_6$ plasma may be used as the etching plasma. In an additional or alternatively advantageous embodiment, the etching plasma includes xenon difluoride ($X_eF_2$) or chlorine trifluoride ($ClF_3$).

In a particularly advantageous further refinement, an etching step and a polymerization step, respectively, are carried out in an alternating sequence in the plasma etching method. In this context, the etching steps and polymerization steps are controlled independently of one another. In this context, a polymer is applied during every polymerization step, in a lateral region predefined by an etching mask, the polymer being removed again during the subsequent etching step. The sequence of separate etching steps and polymerization steps ensures, on the one hand, a particularly high degree of anisotropic etching with high selectivity, a simultaneous presence of etchants and polymer formers in the plasma being reliably prevented, on the other hand. Thus, a particularly high etch rate can be achieved, almost neutral etching edges being able to be produced in the substrate wafer.

For a particularly high level of variability in the sectioning method with respect to predefined process parameters, such as a maximum allowable processing time, the plasma pressure, the plasma power, and/or acceleration voltage U are advantageously controlled as operating parameters for adjusting a predefinable etch rate. In this context, an etch rate between 5 and 50 $\mu$/min is set in a particularly advantageous manner by suitably selecting the plasma pressure and plasma power.

In a particularly advantageous manner, the sectioning method is used within the framework of the manufacture of microelectronic or microelectronic-mechanical components. In this context, the substrate wafer is advantageously first coated by a succession of coating steps and patterning steps in such a manner that a plurality of components limited only by the size of the substrate wafer and the number and position of the separating lines provided during the formation of the substrate chips are produced on the wafer's surface. Subsequently, the substrate wafer is sectioned into substrate chips by the deep patterning method in such a manner that every substrate chip supports a component.

Advantageously, the substrate wafer is coated with an etching mask prior to the deep patterning, in the regions intended for forming the substrate chips. It is, therefore, ensured that the etching operation is limited to only the desired separation areas between the substrate chips to be produced, in particular without possibly endangering the component patterns on the substrate chips. In this context, especially for processing substrate wafers made of silicon, a coating of $SiO_2$ is advantageously applied as an etching mask to the substrate wafer.

In particular, advantages targeted by the present invention include that all separating lines provided on the surface of the substrate wafer can be simultaneously processed due to the driving direction of the separating method, which is directed into the depth of the substrate wafer. Thus, a complete sectioning of the substrate wafer into substrate chips in a particularly short processing time is rendered possible even for substrate-chip surface areas deviating from a rectangular shape. In addition, the lateral expansion of the separating lines can be limited to a width of approximately 2 $\mu$m by the separating method. In comparison, a saw process results in a width of the separating lines of about 50 to 100 $\mu$m, so that in this case, only a correspondingly reduced overall surface is available for attaching components. Furthermore, using a deep patterning method, the separating method mechanically stresses the substrate wafer in a significantly reduced manner in comparison with a saw process, so that the danger of breaking during sectioning is decreased. The separating method, therefore, enables a particularly high manufacturing stability for the production of the substrate chips.

BRIEF DESCRIPTION OF THE DRAWINGS

FIG. 2 shows a top view of a substrate wafer.

FIG. 3 shows a detail of the substrate wafer according to FIG. 2.

FIG. 4 shows a cross-section of the substrate wafer according to FIG. 2.

FIG. 5 shows a detail of the substrate wafer according to FIG. 4 in a pre-sectioning state.

FIGS. 7a–7d each show a top view of a plurality of substrate chips.

DETAILED DESCRIPTION

Figure 1:
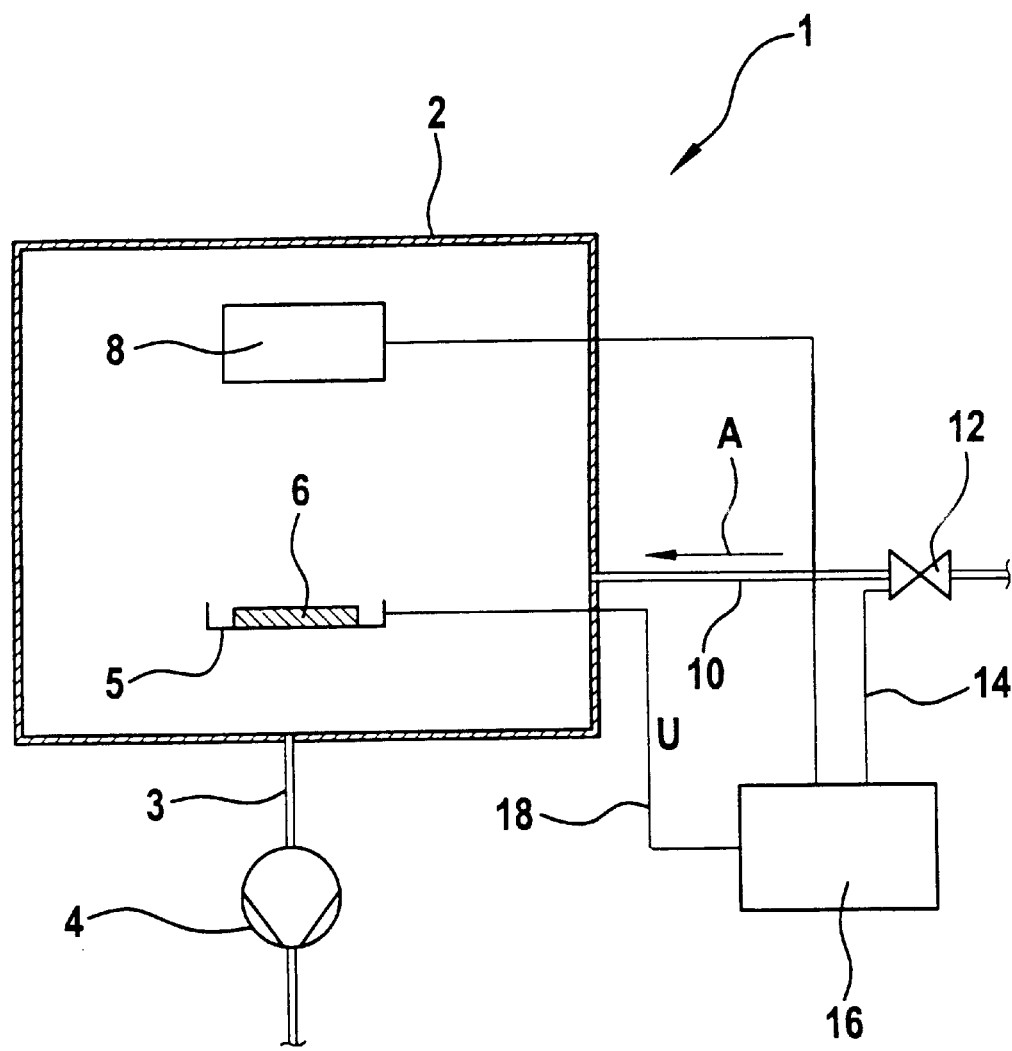
FIG. 1 schematically shows a plasma etching system.

Identical parts are provided with the same reference numerals in all of the figures.

Plasma etching system 1 according to FIG. 1 includes an etching chamber 2 designed as a vacuum chamber whose interior can be forced via a pump system 4 connected into a suction line 3 into a state of preselectable pressure that is low in relation to the external space. Arranged in etching chamber 2 is a substrate holder 5 on which a substrate wafer 6 can be attached for further processing. Furthermore, a microwave generator 8 is situated in etching chamber 2. A gas line 10 for supplying a working gas A, whose flow rate can be adjusted via a control valve 12, is connected to etching chamber 2. In the exemplary embodiment, a mixture of sulfur hexafluoride ($SF_6$) and argon (Ar) is provided as working gas A or etching gas. However, another suitable working gas can also be used. Control valve 12 is connected on the incoming side via a data line 14 to a control device 16 to which microwave generator 8 is also connected. In addition, the electrical potential of substrate holder 5 can be set in relation to the ambient potential, and particularly in relation to the electrical potential of etching chamber 2, in the form of an acceleration voltage U via control device 16 and a line 18 connected thereto.

Plasma etching system 1 is designed as a deep patterning method for implementing a plasma etching method. To implement the plasma etching method, the object to be etched is placed on substrate holder 5. After completing the evacuation of etching chamber 2, i.e., after setting, in etching chamber 2, a maximum background pressure predefined, for example, by requirements for maintaining purity, working gas A is supplied as an etching gas via gas line 10. In this context, working gas A is supplied via control valve 12 under fine adjustment monitored by control device 16 until a pressure level necessary for implementing the deep patterning is reached in etching chamber 2.

To implement the actual etching process, energy is supplied in the form of microwaves to etching or working gas A via microwave generator 8. As a result, working gas A is partially ionized and, thus, forms a plasma or etching plasma. Part of the thereby produced plasma ions, e.g., the positively charged cations, are then accelerated by acceleration voltage U toward substrate holder 5 and, thus, toward the object to be etched which is fastened thereto and impinge in the case of a corresponding assembly of substrate holder 5 in an almost vertical direction upon the surface of the object to be etched. In response to the impingement, the ions accelerated in the plasma chemically react with the material of the substrate wafer, volatile reaction products being produced, and the material of the substrate wafer being locally dissolved. Furthermore, they knock off debris from the surface of the object, thereby employing an etching operation. In response to the surface areas of the object that are not to be etched being suitably covered, this process is restricted to the surface areas to be etched. In this context, the etch rate, i.e., the thickness of the surface layer removed per time unit from the object to be etched, can be influenced by control device 16 as a result of regulating actions on the operating parameters, supply rate of working gas A into etching chamber 2, pressure of the plasma or working gas A in etching chamber 2, acceleration voltage U, and/or power input supplied via microwave generator 8 into the plasma.

The plasma etching system 1 designed as a deep patterning method for carrying out the plasma etching method is provided within the framework of a method for producing, among other things, substrate chips 20 carrying electronic components 19 to be used for sectioning substrate wafer 6 into a plurality of substrate chips 20. For reasons of production engineering, it is provided in the manufacture of components 19 that the necessary material layers be deposited on a shared substrate wafer 6, as shown from a top view in FIG. 2 and in greater detail in FIG. 3, according to conventional methods, in a succession of coating steps and patterning steps for a plurality of components 19. After depositing the material layers for components 19, it is provided that substrate wafer 6 be sectioned into a plurality of substrate chips 20, each of which supports a component 19. In this context, in the example according to FIGS. 2 and 3, separating lines 24 between substrate chips 20 can run in a rectangular pattern. In this instance, components 19 are positioned on substrate wafer 6 under consideration of the process parameters for the later sectioning among other things. In particular, width b of separating lines 24 to be considered in this context for the sectioning is taken into account.

A cross section of a substrate wafer 6, which is already coated with the material for components 19 and is already prepared for sectioning, and a cross section of an enlarged detail of the substrate wafer is shown in FIG. 5. Components 19 made of a plurality of material layers are deposited on substrate wafer 6. The lateral spaces between components 19 are provided for accommodating separating lines 24, which result from the subsequent sectioning. Test patterns 26 enabling a check of the maintenance of predefined directional quantities in an intermediate step of the entire production process can also be provided According their arrangement on substrate wafer 6, test patterns 26 can be situated in the region of a separating line 24 and can be lost during sectioning or can, however, also be situated outside of separating lines 24 and, thus, retained even after sectioning.

Substrate wafer 6 according to FIGS. 4, 5 is mounted or laminated on a carrier film 28, which is fixed in a frame 30. In this context, frame 30 is designed as a metal frame in the exemplary embodiment. However, a plastic frame can also be provided. Every component 19 is covered by an etching mask 32. In the exemplary embodiment, a coating of silicon dioxide ($SiO_2$) is applied in each case as etching mask 32. Alternatively, another suitable etching mask can also be provided, e.g. a coating of $Si_3N_4$, nitride, polyamide, or photoresist. In the exemplary embodiment, etching masks 32 are applied by chemical vapor deposition (CVD) and subsequently patterned. Alternatively, another suitable coating method can also be used.

As is particularly recognizable in FIG. 5, etching masks 32 have a cut-out in a central region 34, over every component 19. Situated under this cut-out is a contact surface 36, which allows the respective components 19 to be contacted in a later phase. These contact surfaces 36, also called bond pads, are particularly designed for contacting by bonds. Etching masks 32 are laterally dimensioned in such a manner that a region 38 between two respective components 19 remains uncovered.

The substrate wafer 6 prepared in such a manner is attached for sectioning to substrate holder 5 and situated within etching chamber 2. The deep patterning method, which represents a selective deep patterning method for silicon especially due to the use of a working gas A containing silicon hexafluoride, is implemented for sectioning the wafer into substrate chips 20. In this context, those regions 38 are etched in which the silicon forming substrate wafer 6 is exposed to the etching plasma formed by working gas A. However, no etching occurs in those regions in which etching masks 32 are present. Due to the characteristic properties of this method, it has a driving direction, also referred to as anisotropy, mainly directed into the depth of substrate wafer 6. In addition, all of the separating lines 24 provided on the surface of substrate wafer 6 can be simultaneously processed in a single operation. In response to the etching step being implemented, the plasma pressure, the plasma power, and acceleration voltage U are adjusted in such a manner that the result is an etch rate between 5 and 50 $\mu$/min.

During the etching operation, an etching step and a polymerization step are carried out in an alternating manner. In each polymerization step, a polymerization mixture is let into etching chamber 2. In the exemplary embodiment, a polymerization mixture of trifluoromethane ($CH F_3$) and argon (Ar) is provided. Alternatively, another suitable mixture based on perfluorinated aromatics having suitable side groups, such as perfluorinated, styrene-like monomers or ether-like fluoro compounds, can also be used. In this context, the polymerization mixture has a gas flow of 0 to 100 standard $cm^3$ and a process pressure of 0.01 to 0.1 mbar.

During the respective polymerization steps, the surfaces cleared in the previous etching step, i.e., particularly the surfaces of regions 38 as well as their lateral surfaces, are uniformly covered with a polymer. This polymer layer forms an effective, provisional etch stop for the subsequent etching step. In the following etching step, the polymer is removed again, the polymer from the surface of regions 38 being deposited in the immediate vicinity, i.e., on the lateral surfaces or the etching edge, thereby protecting them. This additional protection of the edges increases the already present, desired anisotropy of the actual etching step.

Figure 6:
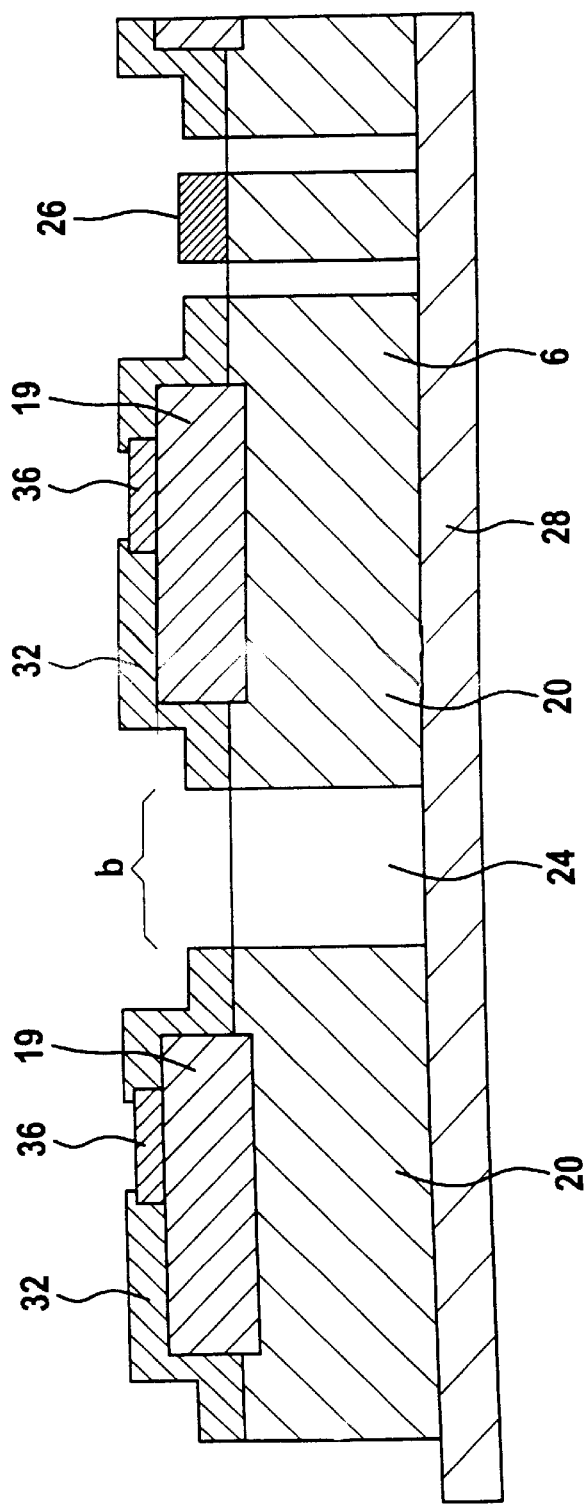
FIG. 6 shows a detail according to FIG. 5 in a post-sectioning state.

After the etching operation is completed, separating lines 24 form in the regions not covered by etching masks 32, as shown in FIG. 6. In these lines, the silicon of substrate wafer 6 is completely removed; the etching operation is first stopped on the boundary surface to carrier film 28. Thus, substrate wafer 6 is completely sectioned into substrate chips 20. The lateral expansion of separating lines 24 can be restricted to a width b of about 2 $\mu$m. In comparison, when sectioning substrate wafer 6 into substrate chips 20, a saw process results in separating lines 24 having a width of approximately 50 to 100 $\mu$m, so that in this case, only a correspondingly reduced overall surface is available for attaching components 19 to substrate wafer 6.

In this method, the form and adjustable pattern of separating lines 24 on the surface of substrate wafer 6 are independent of the crystal directions of substrate wafer 6, and the material of substrate wafer 6 can be removed independently of the lateral position. As a result, the method permits the manufacture of substrate chips 20 having diverse designs, a few of which are shown in FIGS. 7a–7d, for example.

What is claimed is:

1. A method for sectioning a substrate wafer into a plurality of substrate chips, comprising:

providing a substrate wafer from which a plurality of substrate chips are to be separated; and separating the plurality of substrate chips from one another by selective deep patterning using one side of the substrate wafer.

2. The method according to claim 1, wherein the substrate wafer is a silicon wafer, and wherein the separating step includes separating the plurality of substrate chips from one another using a selective deep patterning method for silicon.

3. The method according to claim 1, wherein the separating step includes selective deep patterning using plasma etching.

4. The method according to claim 3, wherein the separating step includes providing an etching plasma, the etching plasma including a sulfur hexafluroide ($SF_6$).

5. The method according to claim 3, wherein the plasma etching includes an alternating sequence of etching steps and polymerization steps.

6. The method according to claim 3, further comprising:

controlling at least one of i) plasma pressure, ii) the plasma power, and iii) an acceleration voltage, as an operating parameter for setting a preselectable etch rate.

7. The method according to claim 6, further comprising:

selecting the plasma pressure and plasma power as operating parameters to set the etch rate between 5 and 50 $\mu$/min.

8. The method according to claim 1, further comprising:

providing each of the substrate chips with a microelectrical or microelectro-mechanical component pattern.

9. The method according to claim 1, further comprising:

prior to deep patterning, coating the substrate wafer with an etching mask in those regions that are designated for forming the substrate chips.

10. The method according to claim 9, wherein the coating step includes applying silicon dioxide ($SiO_2$) as the etching mask.

11. A method for sectioning a substrate wafer into a plurality of substrate chips, comprising:

providing a substrate wafer from which a plurality of substrate chips are to be separated; and separating the plurality of substrate chips from one another by selective deep patterning using a single deep patterning source.

* * * * *

UNITED STATES PATENT AND TRADEMARK OFFICE
CERTIFICATE OF CORRECTION

PATENT NO. : 6,406,979 B2 Page 1 of 1
DATED : June 18, 2002
INVENTOR(S) : Fischer et al.

It is certified that error appears in the above-identified patent and that said Letters Patent is hereby corrected as shown below:

Column 3,
Line 2, change "$X_c\ F_2$" to -- $X_e\ F_2$ --;

Column 5,
Line 51, change "provided According their" to -- provided. According to their --;

Column 7,
Line 26, "hexafluroide" to -- hexafluoride --.

Signed and Sealed this

Twenty-fifth Day of November, 2003

JAMES E. ROGAN
*Director of the United States Patent and Trademark Office*